United States Patent
Koshida et al.

[11] Patent Number: 5,981,060
[45] Date of Patent: Nov. 9, 1999

[54] DECORATIVE MEMBER

[75] Inventors: Mitsuhiko Koshida; Kazunori Takenouchi, both of Kokubu; Kouichi Kijima; Shinichi Hayashi, both of Sendai, all of Japan

[73] Assignee: Kyocera Corporation, Kyoto, Japan

[21] Appl. No.: 09/084,826

[22] Filed: May 26, 1998

[30] Foreign Application Priority Data

May 27, 1997 [JP] Japan ..................................... 9-137136

[51] Int. Cl.$^6$ .............................. B32B 9/00; A44C 27/00
[52] U.S. Cl. .................... 428/336; 428/408; 428/698; 428/701; 428/702
[58] Field of Search .................. 428/408, 336, 428/698, 701, 702

[56] References Cited

U.S. PATENT DOCUMENTS

| | | | |
|---|---|---|---|
| 4,960,643 | 10/1990 | Lemelson ................................. | 428/408 |
| 5,094,985 | 3/1992 | Kijima et al. .............................. | 501/88 |
| 5,112,643 | 5/1992 | Ikegaya et al. ......................... | 423/446 |
| 5,173,089 | 12/1992 | Tanake et al. ............................. | 51/309 |
| 5,225,275 | 7/1993 | Aida ......................................... | 428/408 |
| 5,227,196 | 7/1993 | Hoh ......................................... | 427/249 |

FOREIGN PATENT DOCUMENTS

| | | |
|---|---|---|
| 0808921 | 11/1997 | European Pat. Off. . |
| 62-180071 | 8/1987 | Japan . |
| 1244705 | 9/1989 | Japan . |
| 1265841 | 10/1989 | Japan . |
| 8120481 | 5/1996 | Japan . |

*Primary Examiner*—Archene Turner
*Attorney, Agent, or Firm*—Loeb & Loeb LLP

[57] ABSTRACT

There is Provided a decorative member having a coat of a hard carbon layer on a surface of a ceramic base, wherein the hard carbon layer has peaks in the ranges of wave numbers $1160\pm40$ cm$^{-1}$, $1340\pm40$ cm$^{-1}$ and $1500\pm60$ cm$^{-1}$ of Raman spectra, and maximum intensity $H_1$ of the peak residing in the range of $1160\pm40$ cm$^{-1}$, maximum intensity $H_2$ residing of $1340\pm40$ cm$^{-1}$ cm$^{-1}$ and maximum intensity $H_3$ residing $1500\pm60$ cm$^{-1}$ satisfy the following relations: $0.02 \leq H_1/H_2 \leq 1.0$ and $H_2 < H_3$, said member showing an excellent corrosion resistance, having no oozing out of a solution of a metal causing allergy on a human body and having a required mechanical properties.

3 Claims, 2 Drawing Sheets

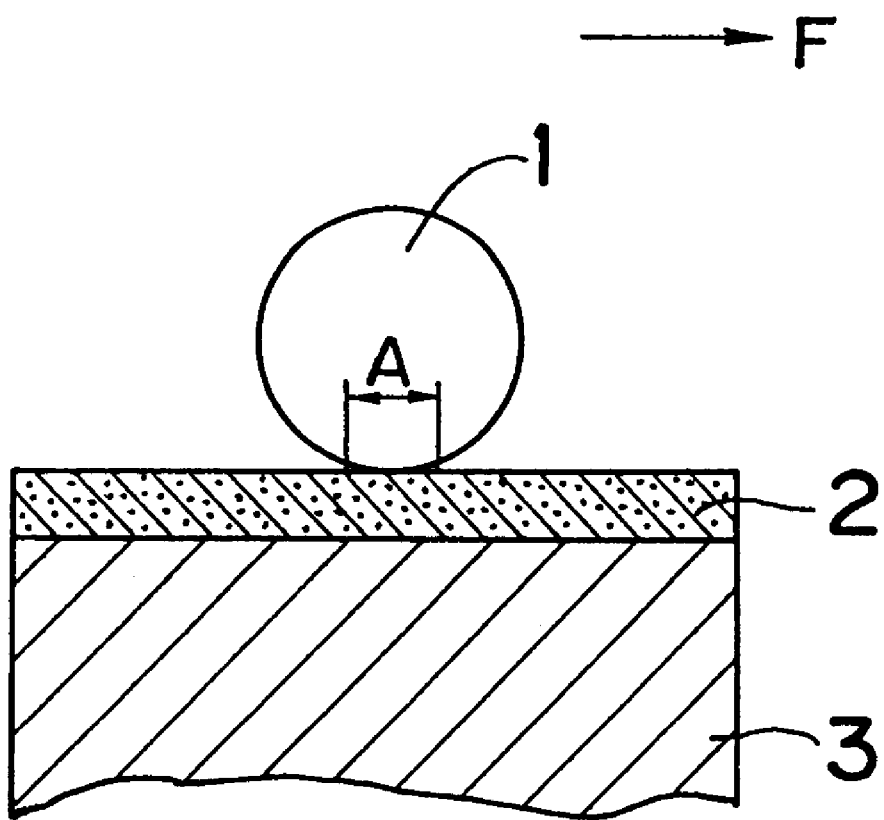

DECORATIVE MEMBER

BACKGROUND OF THE INVENTION

1. Field of the Invention

The present invention relates to a decorative member covered with a hard carbon layer.

2. Prior Art

Conventionally, decorative members, containing watch components such as watch cases and watch bands; ornaments such as cuff buttons, metal parts for bags, lighters; finger rings, necklaces, piercing earrings and brooches; frames for eyeglasses; and line guides such as fishing line guides and fiber guides, have required not only ornament or decorative value but high resistance to abrasion or wear. There are a decorative member formed from a metal having a tonality similar to the real color of gold, which has a gold-plated surface on a base metal made of brass or the like (see Japanese Patent Publication JP-A 8-120481). Decorative members are also known to be made of ceramics as a base, whose surface were covered with titanium nitride and shows a golden color, more excellent in wear resistance than gold is (see Japanese Patent Publication JP-A 1-265841).

However, the decorative members mentioned above which are made of the metal have problems in regard to weatherability, corrosion and abrasion resistance and their very short lifetime in use. In addition, in the case where Ni is included in the metal of a decorative member, there is a risk that some people is affected by metal allergy if the decorative member is put on.

Although a gold-plated decorative member has golden brilliancy in its early stage of use, it is poor in corrosion in an environment in which acid or alkaline chemicals are used, and subjected to a surface injury since gold is a soft metal, so that there has arisen another problem that its peculiar brilliancy is lost over its repeated uses.

While a decorative member covered with titanium nitride is excellent in abrasion resistance as compared with the decorative members as shown above, a longer stability of the resistance has additionally been demanded.

There has been proposed, for the purpose of a superficial protection of the surface, formation of a layer made of hard carbon such as diamond on a surface of gold and its alloy in Japanese Patent publications JP-A 62-180071 and JP-A 1-244705).

However, hard carbon layers, described in the Japanese Patent publications JP-A 62-180071 and JP-A 1-244705 above, made of a high purity diamond formed by means of Plasma CVD process or the like. Such high purity diamond layers are conspicuous in diamond crystal growth, therefore there was the problem that the crystal grains are too large to form a thin layer and the formation of a sounder layer formation requires some degree of thickness.

Furthermore, there are minute asperities on the surface made of the diamond layer of the member to cause irregular reflection of light on the surface. The problem of irregularly reflecting light on the surface can be solved by polishing the layer surface, but it takes a very long time for the mirror-polishing of the hardened surface of the diamond layer, whereby productivity is much decreased. Still besides, there was a problem that crystal grain boundaries are in this diamond layer and a number of voids are present in the bulk of the layer, causing local corrosion to occur by the chemicals easily.

SUMMARY OF THE INVENTION

An object of the present invention, in view of the above problems, is to provide a decorative member which is formed by using a hard carbon layer with necessary mechanical and chemical properties to obtain high durability without lost of the decorative value for a decorative member.

The present invention is directed to modifying the microstructure of the hard carbon layer to fine crystal grains without porosity.

Particularly, the present invention uses the microstructure of the film containing diamond crystal and the a diamond precursor or a polyene which corresponding to the Raman peak in the range of $1160\pm40$ cm$^{-1}$ causing the layer to be composed of the densifyed fine-grained crystal with resistance to both wear and corrosion in the corrosive environment enhanced.

More particularly a decorative member of the present invention comprise a hard carbon layer on the surface of a ceramic base, wherein the hard carbon layer has peaks in the ranges of wave numbers $1160\pm40$ cm$^{-1}$, $1340\pm40$ cm$^{-1}$ and $1500\pm60$ cm$^{-1}$ of Raman spectra, the following relations are satisfied:

$$0.02 \leq H_1/H_2 \leq 1.0,$$

and;

$$H_2 < H_3,$$

where $H_1$, $H_2$ and $H_3$ are the maximum intensities residing in the range of $1160\pm40$ cm$^{-1}$, $1340\pm40$ cm$^{-1}$ and $1500\pm60$ cm$^{-1}$, respectively.

BRIEF DESCRIPTION OF THE DRAWINGS

The invention is described in detail below in reference to the accompanying drawings, in which;

FIG. 3 is a representation showing a scratch test of a hard carbon layer with respect to some hard ball, for estimating of its resistance to scratch.

DETAILED DESCRIPTION OF THE PREFERRED EMBODIMENTS

Figure 1:
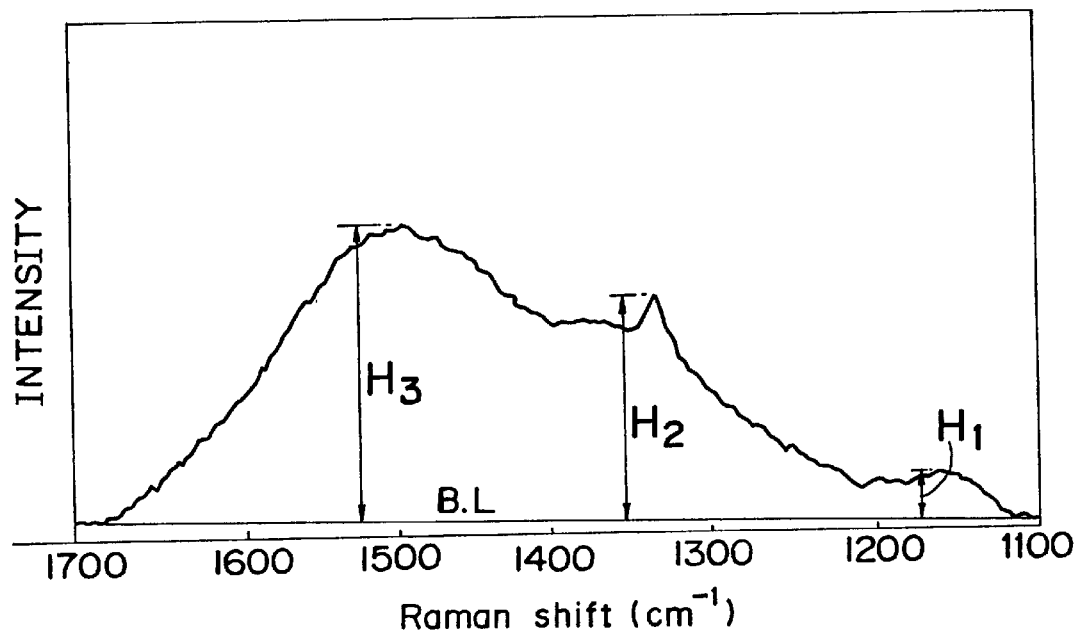
FIG. 1 is Raman spectra chart of a hard carbon layer of an embodiment according to the present invention.

This hard carbon layer is mainly constituted by diamond whereas such a diamond layer as widely known is made of a high purity diamond a great part of which has a structure in that carbon atoms are bonded with an sp$^3$ hybridized orbital and exhibit a peak at $1340\pm40$ cm$^{-1}$ in Raman spectra. A small part of the diamond layer includes carbon of a graphite structure such that carbon atoms are bonded with an sp$^2$ hybridized orbital and exhibit a broad peak in the vicinity of 1500 to 1600 cm$^{-1}$ in the spectrum.

However, if a diamond layer consist of the two components, diamond and graphite, the diamond layer contains large diamond crystal grains as well known, causing large asperities to occur on the surface after layer formation. The crystal grain boundaries and a great number of voids are present in the bulk of the layer, whereby the layer surface is apt to be corroded by chemicals.

On the other hand, a hard carbon layer according to the present invention is mainly constituted by diamond and shows a peculiar peak in Raman spectra resided at least in the ranges of $1160\pm40$ cm$^{-1}$ besides the above-mentioned peak of $1340\pm40$ cm$^{-1}$. Among Raman peaks, the peak in the range of $1340\pm40$ cm$^{-1}$ shows a peak of diamond crystals, and the peak in the range of $1160\pm40$ cm$^{-1}$ is considered to show the presence of a diamond precursor or a polyene structure, which means the layer is composed of very fine crystals.

In addition, the hard carbon layer of the present invention has a peak in the range of 1500±60 cm$^{-1}$ which shows an amorphous phase present between diamond crystals, and since the amorphous phase fills up the voids in the layer, a density of the layer can be increased.

Therefore, the hard carbon layer of the present invention is constituted of very fine diamond crystals with each of a grain diameter of 1 µm or less on the average, to obtain a highly densified layer with almost no voids in the layer.

As described above, in the present invention, since the hard carbon layer has a large hardness, composed of fine crystals very closely packed and has no voids in the bulk of the layer, the layer does not suffer from local corrosion due to voids or crystal grain boundaries in the layer even in contact with the chemicals such as an acid, alkali or the like. Such a layer can exert an excellent corrosion resistance. In addition, the layer is also high in flatness without asperity on the surface which have conventionally been often observed on the surface of a diamond crystal. Moreover, the layer has large hardness and high resistance to abrasion even if it includes a small amount of a graphite structure.

Accordingly, the hard carbon layer as mentioned above which is formed on a surface of a ceramic member can produce a dense layer, whose surface is flat and smooth, and which has a contour closely following the superficial shape and condition of the ceramic member. For that reason, even in a decorative member which requires corrosion resistance and high flatness, a hard carbon layer with excellent smoothness can be formed on the surface of the base ceramics finished to a desired, appropriate surface roughness.

Moreover, if necessary, polishing the surface can be easy to perform as compared with the conventional diamond layer and a layer surface without any voids can be obtained.

In addition, since the hard carbon layer is very densified, local corrosion of a base material through voids or crystal grain boundaries in the layer does not occur and shows excellent corrosion resistance. Even if the member is composed in a Ni plated underlayer or the like and contacts with sweat, sea water or the like, solution of Ni causing an allergy can be prevented from oozing out by the diamond layer on the underlayer.

Raman spectra peak intensity of a hard carbon layer according to the present invention will be described in a detailed manner. The hard carbon layer of the present invention has, as shown in FIG. 1, two peaks at least in the ranges of wave numbers 1340±40 cm$^{-1}$ and 1160±40 cm$^{-1}$ in the Raman spectrum. The peak intensity in the range of 1160±40 cm$^{-1}$ is determined by a base line drawn between 1100 cm$^{-1}$ and 1700 cm$^{-1}$. In the invention, the maximum intensity $H_1$ in the range of 1160±40 cm$^{-1}$ and the maximum intensity $H_2$ in the range of 1340±40 cm$^{-1}$ should have the following important relation by a peak intensity ratio ($H_1/H_2$)

$$0.02 \leq H_1/H_2 \leq 1.0$$

As peak ratio $H_1/H_2$ is less than 0.02, the diamond crystal grains grow so large as to produce many voids in the layer and a surface roughness, causing local corrosion to easily proceed in the environment in which a chemical is used. Alternatively, as peak ratio $H_1/H_2$ is more than 1.0, hardness of the layer has a chance to be reduced since a content of diamond crystals in the layer is decreased; accordingly, the peak ratio $H_1/H_2$ should be adjusted to be 1.0 or less.

The hard carbon layer of the present invention also may have another peak in the range of 1500±60 cm$^{-1}$ of Raman spectra as well and for the maximum peak intensity $H_3$ in the range, the following relation is satisfied:

$$H_2 < H_3$$

Thereby, it is also important that the following relation is satisfied:

$$H_1 \leq H_2 < H_3$$

This peak in the range of 1500±60 cm$^{-1}$ of Raman spectrum shows presence of a third amorphous phase between diamond crystal grains, and the third phase increases density of the layer because the voids in the layer are filled up with the phase, which effectively can prevent oozing out of a Ni solution from occurring.

Ceramics, which is base material covered with a hard carbon layer as mentioned above desirably has mechanical strengths necessary as a decorative member. Mechanical properties required for a decorative member are:

1) not to be broken down even if a load is imposed on the member;
2) not to be chipped off
3) not to feel a weight when the member is worn;
4) not to be deformed into a recess if the member is hit by a hard matter; and
5) not to be deformed or warped.

For this end, the ceramics as a base are required to have three point flexural strength of 880 MPa or more, fracture toughness of 4.5 M/m$^{1/2}$ or more, specific gravity of 6.0 or less, Vickers hardness of 10.8 GPa or more and Young modulus of 200 GPa or more. For example the ceramics to satisfy these requirements may be selected from ceramics mainly constituted of silicon nitride, zirconia, and TiC and TiN based thermets.

Here, the ceramics mainly constituted of silicon nitride contains silicon nitride ($Si_3N_4$) as a main component, and the starting materials including $Al_2O_3$, $Y_2O_3$, WC as sintering aid is molded in a predetermined form as a preform. The preform is sintered in a nitrogen atmosphere at a temperature in the range of 1700 to 1900° C. The Ceramics mainly comprising zirconia is partially-stabilized zirconia ceramics mainly composed of tetragonal crystal system. The starting material comprising zirconia ($ZrO_2$) as a main component, and $Y_2O_3$, MgO, CaO, $CeO_2$, $Dy_2O_3$ and the like as a stabilizer is molded to a preform in a predetermined form and the preform is calcined in an oxygen atmosphere at a temperature on the range of 1300 to 1500° C.

Besides, TiC based thermet is obtained in a manner such that the starting material comprising TiC, TiCN and the like as a hard component and an iron family metal such as Ni, Co, Fe and the like as a metal component, which is molded to a preform in a predetermined form. The preform is fired in a vacuum atmosphere at a temperature in the range of 1300 to 1500° C. TiN-base thermet is obtained in a manner such that a raw material composed of TiN, $TiO_2$ and the like as a hardening component and an iron family metal such as Ni, Cr and the like as a metal component is molded to a preform in a predetermined form and the preform is fired in a vacuum atmosphere at a temperature in the range of 1300 to 1500° C.

Thickness of the hard carbon layer preferably is in the range of 1.0 to 10.0 µm on the average. The reason why is that if the thickness is smaller than that 1.0 µm and a scratching force is applied to the layer, the base is easy to be exposed. Also, to the contrary if a thickness is larger than 10.0 µm, a layer is raised from the base surface, so that a thickness is especially preferable in the range of 2.0 to 8.0 µm.

In order to increase adhesiveness between the hard carbon layer and the ceramics base, an intermediate layer made of a composite of at least diamond and a metal carbide can be laid between both.

The reason why a level of the adhesive strength is increased between a hard carbon layer and a ceramic base is estimated as follows:

Atoms are bonded therebetween with the help of electrons lying therebetween and in general, a covalent bond in which electrons are shared by both atoms is stronger than an ionic bond in which an electron is present exclusively in one of the atoms in bond and a bond is established by an electric coupling. Diamond has carbons which bond each other by covalent bond and thus diamond has a strong bonding force therein. Therefore, in order to increase adhesive strength, it is desirable that a compound having a covalent bond that is an analogous bonding mode to diamond, is used as an intermediate layer and it is estimated that the intermediate layer including carbon which is a constituent of diamond is more preferably employed because of good interface matching therebetween.

As such a metal carbide having a covalent bond, silicon carbide, boron carbide can be used and silicon carbide is most desirable in use for a decorative member of the present invention.

Moreover, this intermediate layer is present in such a state that diamond and a hard carbon layer are not present as separate layers but shows a texture such that the layer surrounds a metal carbide and diamond is distributed like islands in the matrix and therefore, its adhesiveness is improved owing to called anchoring effect.

As a method of forming the hard carbon layer, called plasma CVD method or thermal filament method has conventionally a main stay in which a carbon layer is formed on a predetermined member surface by plasma generated by microwave or high frequency. However, in the plasma CVD method, a plasma generating region is small, therefore a area in which a layer is formed is also small and the maximum area is generally on the order of that of a diameter of 20 mm, which limits applications as a decorative member if the base has a complex structure or a structure having a curved surface, a uniform plasma which conforms with a profile of the structure of the base cannot be obtained at high pressure or in low plasma density, making the layer thickness distribution uneven with ease.

On the other hand, in the thermal filament CVD method, filaments are apt to be subjected to disconnection. The filament is required to be located in such a way as coincide with a profile of the base material in order to suppress fluctuation of a thickness, which makes the apparatus problematic due to lacking a wide applicability.

Accordingly, in the present invention, a hard carbon layer is coated by means of called electron cyclotron resonance CVD method (hereinafter referred to as ECR plasma CVD method) in which a magnetic field is applied over a plasma generating region in the plasma CVD method. According to this ECR plasma CVD method, the high density plasma can be generated, at a low pressure of 1 torr or less, in a uniform manner over a broad region; thereby, the uniform layer being formed in the area of about ten times as wide as that of the ordinary plasma CVD method.

A method for coating the hard carbon layer on the base material by using ECR plasma CVD method will be described in detail below. A reactive gas is first introduced into a reaction furnace in which a ceramic base as a mother material is placed in a reactive region, and a microwave at 2.45 GHz and a magnetic field on a level of 875 gauss or more are simultaneously applied in the region of the furnace. Application of the magnetic field activates electrons to cause cyclotron motion based on a cyclotron frequency $f=eB/2.m$, wherein m is a mass of an electron, e is an electric charge of the electron, and B is magnetic flux density.

The electrons may resonate at the microwave frequency of 2.45 GHz in accordance with the cyclotron frequency, to be accelerated at a great extent by absorbing energy of the microwave and collide with neutral molecules to generate a high density plasma while causing ionization. In this case, the base material may be set at a temperature in a range of 150 to 1000° C. and at a pressure in the range of $1 \times 10^{-2}$ to 1 torr in the furnace.

According to the above mentioned method, a composition of the hard carbon layer formed by such a method can be changed according to changes in temperature of the base material, pressure in the furnace and concentration of the reaction gas during layer formation. In a definite manner, as a furnace pressure is higher, a plasma region is smaller, the growth rate of the carbon crystal layer is decreased, but, crystallinity of the layer tends to be improved. As the reactive gas concentration is increased, a size of the grains constituting the layer is reduced and crystallinity of the layer tend is in the trend to deterioration. These conditions may be properly controlled as will be described below, whereby the aforementioned $H_1$, $H_2$ and $H_3$ are respectively adjusted so as to fall within respective predetermined ranges.

In the above mentioned method for forming the layer of a decorative member of the present invention, a gas containing hydrogen and carbon is used as a raw material gas to form the hard carbon layer. The carbon containing gas includes alkanes such as methane, ethane, propane and the like, alkenes such as ethylene, propylene and the like, alkynes such as acetylene, aromatic hydrocarbons such as benzene, cycloparaffins such as cyclopropane, cycloolefines such as cyclopentane. As a carbon source gas, can be used oxygen-containing carbon compounds such as carbon monoxide, carbon dioxide, methyl alcohol, acetone and the like, and nitrogen containing carbon compounds such as mono- (di-,or, tri-) methyl amines, mono- (di- ,or, tri-) ethyl amine and the like. These compounds can be used singly or in combination of two or more kinds.

In order to form an intermediate layer composed of a mixture of diamond and silicon carbide as mentioned above, as a reactive gas, hydrogen gas, a carbon containing gas and a silicon containing gas are only required to be introduced after a diamond nucleus treatment is given. Examples of the silicon-containing gases include halogenated compounds such as silicon tetrafluoride, silicon tetrachloride and silicon tetrabromide, and oxides such as silicon dioxide, silane compounds such as mono-, di-, tri-, tetra-,or, penta-silane, mono-,di-, tri-,or, tetra-methylsilane, silanol compounds such as trimethyl silanol and these compounds may be used singly or in combination of two or more kinds.

EXPERIMENT 1

Base materials of a decorative member are selected from the group of zirconia-based, silicon nitride-based and silicon carbide-based ceramics, TiN-based and TiC-based thermets, aumina-based ceramics, and metals such as gold, silver, nickel and stainless steel. These base materials were used each as a mother material and placed in a furnace of an electron cyclotron resonance CVD apparatus.

Using mixing gases of $H_2$ and $CH_4$ respectively at 294 sccm and 6 sccm, the CVD treatment was conducted in the furnace in conditions of a gas concentration of 2%, at a temperature of the mother material of 650° C. and at a pressure of 0.1 torr for one hours to generate diamond nuclei. Thereafter, $H_2$ gas, $CH_4$ and $Si(CH_3)_4$ gases were used in a ratio of $H_2$ of 294 sccm, $CH_4$ of 6 sccm and $Si(CH_3)_4$ of 0.3 sccm, a magnetic field in maximum intensity of 2K gauss was applied by the electron cyclotron resonance plasma CVD method in conditions of a gas concentration of 2%, at a temperature of the mother material of 650° C. and at a pressure in the furnace of 0.05 torr. Thus, an intermediate layer was formed in mixture of diamond and silicon carbide, having a layer thickness of 1 μm by treating for 3 hours in the conditions of a microwave power of 3.0 KW.

Furthermore, a hard carbon layer is formed to a thickness of 3 μm on the intermediate layer using $H_2$, $CH_4$ and $CO_2$ gases, each having purity of 99.9% or more in conditions of a gas ratio, a gas concentration, a temperature of layer formation and a pressure in the furnace as shown in Tables 1 and 2.

In Specimen No. 1-6 in Table 1, an intermediate layer comprising silicon carbide was formed in the same way as mentioned above with the exception of the gas mixing ratio; $H_2$ of 300 sccm and $Si(CH_3)_4$ of 0.3 sccm employed in the specimen.

Analyses on Raman spectra of the surfaces of hard carbon layers were conducted on each specimen. A line is drawn between a 1100 $cm^{-1}$ and 1700 $cm^{-1}$ of the Raman spectrum in the spectrum chart, and with use of the line as a reference line the maximum intensity of the peak in the range of 1160±40 $cm^{-1}$ and the maximum peak in the range of 1340±40 $cm^{-1}$ were measured as $H_1$ and $H_2$ respectively, and the ratio expressed by $H_1/H_2$ was calculated. The maximum intensity of a peak in the range of 1500±60 $cm^{-1}$ was defined as $H_3$ and relative magnitudes of $H_1$, $H_2$ and $H_3$ were compared.

Figure 2:
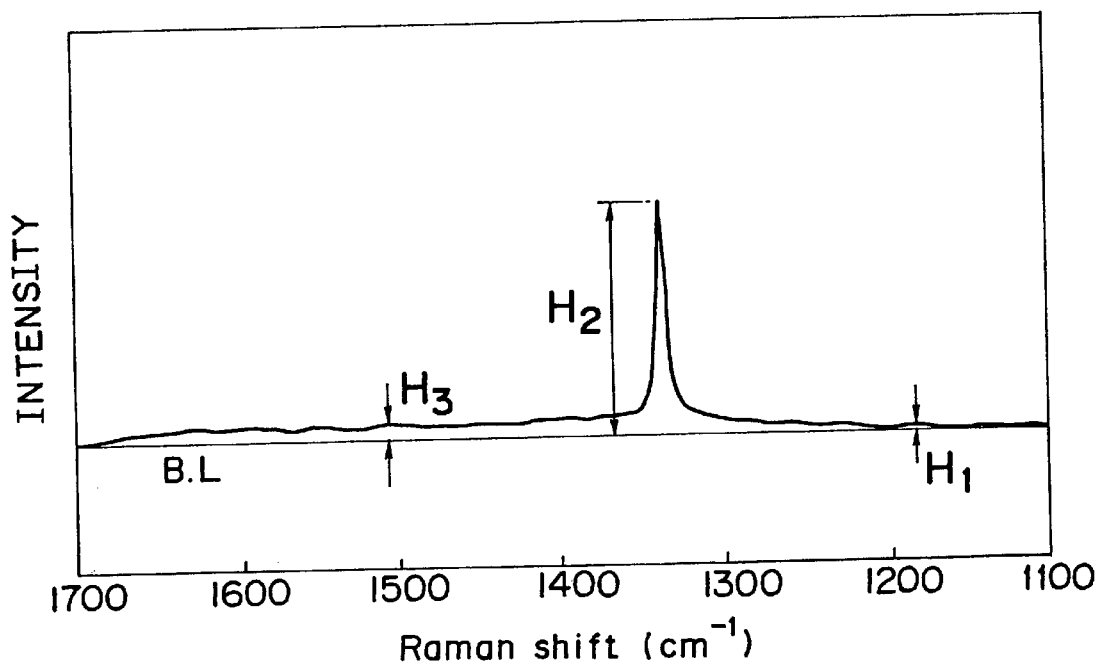
FIG. 2 is Raman spectra chart of a hard carbon layer in a comparative example.

In Table 1, charts of Specimen No. 1-4 (an example of the present invention), and Specimen No. 1-10 (for comparison) were shown in FIGS. 1 and 2 respectively. For the oscillating source for a Raman spectroscope analysis, an Ar laser emitting the oscillating ray of 488.0 nm was used.

Then, the specimens were immersed in an aqua regia for 48 weeks. The layer surfaces of the specimen after the immersion were observed with a binocular microscope to search corrosion states of the specimens, the result being shown in Tables 1 and 2.

According to Tables 1 and 2, it can be seen that specimen Nos. 1-4, 1-5, 1-6, 1-7, 1-8, 1-9, 2-2, 3-2, 4-2, 5-2, 6-2, 7-2, 8-2, 9-2, 10-2 and 11-2 are high in corrosion resistance, in which the hard carbon layers satisfy the peak intensity ratio expressed by $H_1/H_2$ being 0.2 or more and $H_2<H_3$.

TABLE 1

| Specimen No. | Kind of base | Intermediate layer | Reaction gas (sccm) H2 | CH4 | CO2 | Gas concentration (%) | Film formation temperature (° C.) | Furnace pressure (torr) | Thickness (μm) | H1/H2 | Relative magnitudes of H1, H2 and H3 | Corrosion test result, (number of spots/cm²) |
|---|---|---|---|---|---|---|---|---|---|---|---|---|
| 1-1* | ZrO2 ceramics | D + SiC | 284 | 4 | 12 | 5 | 650 | 0.1 | 0.6 | 0.005 | H1 < H2 > H3 | With spotty corrosion (10) |
| 1-2* | ZrO2 ceramics | D + SiC | 260 | 10 | 30 | 13 | 650 | 0.1 | 0.6 | 0.01 | H1 < H2 < H3 | With spotty corrosion (8) |
| 1-3* | ZrO2 ceramics | D + SiC | 220 | 20 | 60 | 27 | 650 | 1.0 | 0.6 | 0.01 | H1 < H3 < H2 | With spotty corrosion (9) |
| 1-4 | ZrO2 ceramics | D + SiC | 240 | 20 | 40 | 20 | 800 | 0.1 | 0.6 | 0.02 | H1 < H2 < H3 | No change (0) |
| 1-5 | ZrO2 ceramics | D + SiC | 240 | 20 | 40 | 20 | 650 | 0.1 | 0.6 | 0.3 | H1 < H2 < H3 | No change (0) |
| 1-6 | ZrO2 ceramics | SiC | 240 | 30 | 30 | 20 | 550 | 0.1 | 0.6 | 0.4 | H1 < H2 < H3 | No change (0) |
| 1-7 | ZrO2 ceramics | D + SiC | 210 | 30 | 60 | 30 | 550 | 0.01 | 0.6 | 0.6 | H1 < H2 < H3 | No change (0) |
| 1-8 | ZrO2 ceramics | D + SiC | 210 | 30 | 60 | 30 | 650 | 0.01 | 0.6 | 1.1 | H2 < H1 < H3 | No change (0) |
| 1-9 | ZrO2 ceramics | D + SiC | 210 | 60 | 30 | 30 | 650 | 0.01 | 0.6 | 1.6 | H2 < H1 < H3 | No change (0) |
| 1-10* | ZrO2 ceramics | D + SiC | 194 | 2 | 4 | 3 | 650 | 30.0 | 0.6 | <0.01 | H1 < H2 > H3 | With spotty corrosion (30) |
| 2-1* | ZrO2 ceramics | D + SiC | 220 | 20 | 60 | 27 | 650 | 1.0 | 0.6 | 0.01 | H1 < H3 < H2 | With spotty corrosion (11) |
| 2-2 | ZrO2 ceramics | D + SiC | 240 | 20 | 40 | 20 | 800 | 0.1 | 0.6 | 0.02 | H1 < H2 < H3 | No change (0) |
| 3-1* | Si3N4 ceramics | D + SiC | 220 | 20 | 60 | 27 | 650 | 1.0 | 0.6 | 0.01 | H1 < H3 < H2 | With spotty corrosion (12) |
| 3-2 | Si3N4 ceramics | D + SiC | 240 | 20 | 40 | 20 | 800 | 0.1 | 0.6 | 0.02 | H1 < H2 < H3 | No change (0) |
| 4-1* | TiN base thermet | D + SiC | 220 | 20 | 60 | 27 | 650 | 1.0 | 0.6 | 0.01 | H1 < H3 < H2 | With spotty corrosion (10) |
| 4-2 | TiN base thermet | D + SiC | 240 | 20 | 40 | 20 | 800 | 0.1 | 0.6 | 0.02 | H1 < H2 < H3 | No change (0) |

1) A * mark shows a specimen with a coat made of a hard carbon film outside the scope of the present invention.
2) In the column of the intermediate layer, D indicates diamond.
3) 1–10 is a specimen with a coat of a hard carbon film formed by means of a microwave CVD method.
4) 2-1 and 2-2 are specimens fabricated in such a manner that a hard carbon film is coated on ZrO2 ceramics formed by means of a coprecipitation method with an intermediate layer interposing therebetween.

TABLE 2

| Specimen No. | Kind of base | Intermediate layer | Reaction gas (sccm) H2 | CH4 | CO2 | Gas concentration (%) | Film formation temperature (°C.) | Furnace pressure (torr) | Thickness (μm) | H1/H2 | Relative magnitudes of H1, H2 and H3 | Corrosion test result, (number of spots/cm$^2$) |
|---|---|---|---|---|---|---|---|---|---|---|---|---|
| 5-1* | TiN base thermet | D + SiC | 220 | 20 | 60 | 27 | 650 | 1.0 | 0.6 | 0.01 | H1 < H3 < H2 | With spotty corrosion (10) |
| 5-2 | TiN base thermet | D + SiC | 240 | 20 | 40 | 20 | 800 | 0.1 | 0.6 | 0.02 | H1 < H2 < H3 | No change (0) |
| 6-1* | SiC ceramics | D + SiC | 220 | 20 | 60 | 27 | 650 | 1.0 | 0.6 | 0.01 | H1 < H3 < H2 | With spotty corrosion (9) |
| 6-2 | SiC ceramics | D + SiC | 240 | 20 | 40 | 20 | 800 | 0.1 | 0.6 | 0.02 | H1 < H2 < H3 | No change (0) |
| 7-1* | Al$_2$O$_3$ ceramics | D + SiC | 220 | 20 | 60 | 27 | 650 | 1.0 | 0.6 | 0.01 | H1 < H3 < H2 | With spotty corrosion (10) |
| 7-2 | Al$_2$O$_3$ ceramics | D + SiC | 240 | 20 | 40 | 20 | 800 | 0.1 | 0.6 | 0.02 | H1 < H2 < H3 | No change (0) |
| 8-1* | Au | D + SiC | 220 | 20 | 60 | 27 | 650 | 1.0 | 0.6 | 0.01 | H1 < H3 < H2 | With spotty corrosion (12) |
| 8-2* | Au | D + SiC | 240 | 20 | 40 | 20 | 800 | 0.1 | 0.6 | 0.02 | H1 < H2 < H3 | No change (0) |
| 9-1* | Ag | D + SiC | 220 | 20 | 60 | 27 | 650 | 1.0 | 0.6 | 0.01 | H1 < H3 < H2 | With spotty corrosion (9) |
| 9-2* | Ag | D + SiC | 240 | 20 | 40 | 20 | 800 | 0.1 | 0.6 | 0.02 | H1 < H2 < H3 | No change (0) |
| 10-1* | Ni | D + SiC | 220 | 20 | 60 | 27 | 650 | 1.0 | 0.6 | 0.01 | H1 < H3 < H2 | With spotty corrosion (10) |
| 10-2* | Ni | D + SiC | 240 | 20 | 40 | 20 | 800 | 0.1 | 0.6 | 0.02 | H1 < H2 < H3 | No change (0) |
| 11-1* | SUS304 | D + SiC | 220 | 20 | 60 | 27 | 650 | 1.0 | 0.6 | 0.01 | H1 < H3 < H2 | With spotty corrosion (11) |
| 11-2* | SUS304 | D + SiC | 240 | 20 | 40 | 20 | 800 | 0.1 | 0.6 | 0.02 | H1 < H2 < H3 | No change (0) |

1) A * mark shows a specimen with a coat made of a hard carbon film outside the scope of the present invention.
2) In the column of the intermediate layer, D indicates diamond.

EXPERIMENT 2

Bases of the same specimens as occurrences of corrosion were not observed in Experiment 1, i.e. specimens Nos. 1-4, 2-2, 3-2, 4-2, 5-2, 6-2, 7-2, 8-2, 9-2, 10-2 and 11-2, were separately duplicated and a specific gravity and hardness of each base was measured according to JIS C 2141 (Testing methods of ceramic insulators for electrical and electronic applications). The results are shown in Table 3.

The Specimens Nos. 1-5, 1-6, 1-7, 1-8 and 1-9 were represented by specimen 1-4.

According to the results of Table 3, specimens using metal materials such as Au, Ag and the like as base materials (Nos. 8-2, 9-2, 10-2 and 11-2) have high commodity values as an personal decorative member. However, they have a fault in that they feel heavy while being worn as a voluminous decorative member because of a high specific gravity.

On the other hand, it can be seen that the specimens made of ceramics i,e, Nos. 1-4, 2-2, 3-1,4-2, 5-2, 6-2 and 7-2 each have a low gravity so that they are desirable for the decorative member. Especially, specimen Nos. 1-4, 2-2, 3-2, 4-2 and 5-2 give a feeling of being light even when being worn as a voluminous decorative member.

The bases made of a metal such as specimen Nos. 8-2, 9-2, 10-2 and 11-2 covered by a hard carbon layer reduce a hardness of the hard carbon layer, compared with ceramics covered by the film, since the hardness of the film influenced by the hardness of the metal base material. Therefore, when a specimen is hit by some hard body, such specimen as Nos. 8-2, 9-2, 10-2 and 11-2 are locally deformed into a recess, while the specimen such as Nos. 1-4, 2-2, 3-2, 4-2, 5-2, 6-2 and 7-2 have got no recess.

TABLE 3

| Specimen No. | Kind of base | Specific gravity | Hardness (GPa) |
|---|---|---|---|
| 1-4 | ZrO$_2$ ceramics | 5.9 | 10.8 |
| 2-2 | ZrO$_2$ ceramics | 6.0 | 12.3 |
| 3-2 | Si$_3$N$_4$ ceramics | 3.3 | 14.5 |
| 4-2 | TiN base thermet | 5.4 | 10.8 |
| 5-2 | TiC base thermet | 5.3 | 18.6 |
| 6-2 | SiC ceramics | 3.0 | 23.5 |
| 7-2 | Al$_2$O$_3$ ceramics | 3.8 | 14.7 |
| 8-2* | Au | 19.3 | 0.2 |
| 9-2* | Ag | 10.5 | 0.2 |
| 10-2* | Ni | 8.9 | 0.6 |
| 11-2* | SUS304 | 7.9 | 3.4 |

1) Mark * shows specimen having a specific gravity and a hardness of whose base are outside the scope of claim 3.
2) Specimen 2-2 is of ZrO$_2$ ceramics formed by means of a coprecipitation method.

EXPERIMENT 3

Base materials of the same specimens as specimens Nos. 1-4, 2-2, 3-2, 4-2, 5-2, 6-2, 7-2, 8-2, 9-2, 10-2 and 11-2 used in Experiment 2 were separately duplicated and Young's modulus of the specimens was measured on each base by use of a supersonic pulse method described in JIS R 16028 (Testing methods for elastic modulus of high performance ceramics). The results are shown in Table 4. After the measurement of a Young's modulus of each base, the bases were coated with layers shown in Tables 1 and 2 and an adhesive strength of a layer was measured on each specimen by means of an indentation method.

The indentation method herein is to evaluate an adhesive strength in such a manner that a load is imposed on a layer by use of Vickers hardness testing machine, and the load at which the layer is separated from a base or the layer is raised from the base is taken as a critical load. The adhesive strength is relatively compared by a magnitude of the critical load. Results of measurement by the method are shown in Table 4, wherein a specimen which was affected by the separation or raising when a load of 5 kgf was applied was marked by X and a specimen which was not affected by the separation or raising was marked by ○.

The results in examples of the present invention using ceramics base (specimen Nos. 1-4, 2-2, 3-2, 4-2, 5-2, 6-2 and 7-2) show the results that no separation occurs.

TABLE 4

| Specimen No. | Kind of base | Young's modulus (GPa) | Adhesive strength |
|---|---|---|---|
| 1-4 | ZrO$_2$ ceramics | 200 | ○ |
| 2-2 | ZrO$_2$ ceramics | 200 | ○ |
| 3-2 | Si$_3$N$_4$ ceramics | 304 | ○ |
| 4-2 | TiN base thermet | 980 | ○ |
| 5-2 | TiC base thermet | 388 | ○ |
| 6-2 | SiC ceramics | 372 | ○ |
| 7-2 | Al$_2$O$_3$ ceramics | 343 | ○ |
| 8-2* | Au | 83 | x |
| 9-2* | Ag | 76 | x |
| 10-2 | Ni | 208 | ○ |
| 11-2* | SUS304 | 197 | x |

1) A * mark shows a specimen a Young's modulus of whose base exhibits a Young's Modulus of less than 200 GPa.
2) 2-2 is ZrO$_2$ ceramics formed by means of a coprecipitation method.

FIG. 3 is a representation showing, as a model, an estimation of the case where a hard carbon layer is scratched with a hard ball. According to Hertz's theory, when a hard ball 1 scratches a hard carbon layer 2 on a base 3, a relation between contact area A and frictional force F is expressed by the following equation:

$$A = \pi \left\{ \frac{3}{4} R \left( \frac{1-v_1^2}{E_1} + \frac{1-v_2^2}{E_2} \right) \right\} W^{2/3}$$

and;

$$F = AS$$

wherein W is a load, R indicates a radius of the hard ball, $E_1$ is a Young's modulus of the hard ball, $E_2$ is a Young's modulus of the base, $v_1$ is Poisson ratio of the hard ball and $v_2$ indicates a Poisson ratio of the base, F is a frictional force and S indicates a shearing stress of the hard carbon layer.

Therefore, under the constant load as Young's modulus of the base 3 is large, the contact area is reduced. As a result, it can theoretically be understood that the frictional force can be reduced and that the hard carbon layer 2 is hard to be separated from the base 3.

EXPERIMENT 4

An adhesive strength was measured by use of the indentation method by setting five levels for a thickness of a hard carbon layer on Si$_3$N$_4$ ceramics and TiN base thermet both of which were good in adhesive strength in Example 3.

Table 5 shows the results of measurement on an adhesive strength by means of the indentation method, wherein the specimens applied by a load of 5 kgf of load is marked by ×1 to show a result if a base is exposed, and by ×2 to show a result if either exposure of a base, or separating or raising occurs and ○ is used to show a result if neither exposure of a base, separating nor raising occurs.

It is found from FIG. 5 that thickness of a hard carbon layer used as a coating of a decorative member is preferably in the range of 1.0 μm to 10.0 μm.

TABLE 5

| Specimen No. | Kind of base | Thickness of intermediate layer (μm) | Thickness of hard carbon layer (μm) | Adhesive strength |
|---|---|---|---|---|
| 3-2-1* | Si$_3$N$_4$ ceramics | 1.0 | 0.5 | x 1 |
| 3-2-2 | Si$_3$N$_4$ ceramics | 1.0 | 1.0 | ○ |
| 3-2-3 | Si$_3$N$_4$ ceramics | 1.0 | 3.0 | ○ |
| 3-2-4 | Si$_3$N$_4$ ceramics | 1.0 | 10.0 | ○ |
| 3-2-5* | Si$_3$N$_4$ ceramics | 1.0 | 12.0 | x 2 |
| 4-2-1* | TiN base thermet | 1.0 | 0.5 | x 1 |
| 4-2-2 | TiN base thermet | 1.0 | 1.0 | ○ |
| 4-2-3 | TiN base thermet | 1.0 | 3.0 | ○ |
| 4-2-4 | TiN base thermet | 1.0 | 10.0 | ○ |
| 4-2-5* | TiN base thermet | 1.0 | 12.0 | x 2 |

1) Mark * shows a specimen a thickness of whose hard carbon layer is outside the preferred range of 1.0 to 10.0 μm.

EXPERIMENT 5

Mother materials used in specimen Nos. 1-4, 2-2, 3-2, 4-2, 5-2, 6-2 and 7-2 were separately duplicated and three-point flexural strength was measured based on JIS R 1601 (Testing method for flexural strength (modulus of rupture) of high performance ceramics) and a fracture toughness was measured based on JIS R 1607 (Testing method for fracture toughness of high performance ceramics). The measurements on three-point flexural strength and fracture toughness were shown in Table 6. It is found from the results of Table 6 that specimen Nos. 1-4, 2-2, 3-2, 4-2 and 5-2 each have flexural strength and fracture toughness required as a decorative member.

TABLE 6

| Specimen No. | Kind of base | Three point flexural strength (MPa) | Fracture toughness $K_{IC}$ (MPam$^{1/2}$) |
|---|---|---|---|
| 1-4 | ZrO$_2$ ceramics | 882 | 6.7 |
| 2-2 | ZrO$_2$ ceramics | 980 | 4.5 |
| 3-2 | Si$_3$N$_4$ ceramics | 1151 | 6.7 |
| 4-2 | TiN base thermet | 980 | 14.7 |
| 5-2 | TiC base thermet | 880 | 8.7 |
| 6-2* | SiC ceramics | 613 | 3.4 |
| 7-2* | Al$_2$O$_3$ ceramics | 343 | 4.6 |

1) Mark * shows a specimen a three point flexural strength and a fracture toughness of whose base are less than 880 MPa and 4.5 MPa m$^{1/2}$.
2) 2-2 is ZrO$_2$ ceramics formed by means of a coprecipitation method.

As has been mentioned above, according to the present invention, since a ceramic base is coated with a hard carbon layer specialized by a peak intensity ratio of Raman spectra, which layer, thereby, is made of fine crystal grains, is densified and has a smooth surface, so that an inherent feature of the base is not lost to an great extent, the layer is hard to be injured and oozing out of a Ni solution is prevented form occurring even if a Ni plating layer or the like is included in the base and since the base itself has a sufficient mechanical strength, a decorative member of the present invention has improved durability and safety of its own as a decorative member.

What is claimed is:

1. A decorative member having a hard carbon layer on a surface of a ceramic base, wherein the hard carbon layer has peaks in the ranges of wave numbers 1160±40 cm$^{-1}$, 1340±40 cm$^{-1}$ and 1500±60 cm$^{-1}$ of Raman spectra, and satisfies the following relations;

$$0.02 \leq H_1/H_2 \leq 1.0;$$

and, $$H_2 < H_3,$$

where $H_1$, $H_2$ and $H_3$ are the maximum intensities of the peaks residing in the ranges of 1160±40 cm$^{-1}$, 1340±40 cm$^{-1}$ and 1500±60 cm$^{-1}$, respectively.

2. A decorative member according to claim 1, wherein a thickness of the hard carbon layer is in the range of 1.0 to 10.0 μm.

3. A decorative member according to claim 1, wherein the ceramic base has a three-point flexural strength of 880 MPa or more, a fracture toughness of 4.5 MPa m$^{1/2}$ or more, a specific gravity of 6.0 or less, a Vickers hardness of 10.8 GPa or more and a Young modulus of 200 GPa or more.

* * * * *